United States Patent [19]
Venaleck et al.

[11] Patent Number: 4,906,987
[45] Date of Patent: Mar. 6, 1990

[54] PRINTED CIRCUIT BOARD SYSTEM AND METHOD

[75] Inventors: John T. Venaleck, Madison; Kenneth W. Braund, Mentor, both of Ohio

[73] Assignee: Ohio Associated Enterprises, Inc., Painesville, Ohio

[21] Appl. No.: 941,614

[22] Filed: Dec. 15, 1986

Related U.S. Application Data

[63] Continuation-in-part of Ser. No. 792,482, Oct. 29, 1985, abandoned.

[51] Int. Cl.$^4$ .......................... H04Q 1/18; G11C 11/00
[52] U.S. Cl. ........................... 340/825.83; 340/825.86; 357/45; 357/59; 361/416; 361/410
[58] Field of Search ................ 357/45, 59A, 59 R, 51, 357/80, 59 F; 339/17 CF, 18 C; 365/103; 361/393, 410, 403, 416, 397; 340/825.83, 825.85, 825.86

[56] References Cited

U.S. PATENT DOCUMENTS

| | | |
|---|---|---|
| 3,177,405 | 4/1965 | Gray . |
| 3,234,433 | 2/1966 | Braunagel . |
| 3,271,591 | 9/1966 | Ovshinsky . |
| 3,335,327 | 8/1967 | Damon et al. . |
| 3,340,439 | 9/1967 | Henschen et al. . |
| 3,570,114 | 6/1971 | Bean et al. . |
| 3,611,063 | 10/1971 | Neale . |
| 3,668,299 | 6/1972 | McNeal . |
| 3,683,105 | 8/1972 | Shamash et al. . |
| 3,691,429 | 9/1972 | Glaser . |
| 3,697,818 | 10/1972 | Boursin . |
| 3,702,464 | 11/1972 | Castrucci ............................. 357/80 |
| 3,717,852 | 2/1973 | Abbas et al. . |
| 3,815,077 | 6/1974 | Anhalt et al. . |
| 3,886,577 | 5/1975 | Buckley . |
| 3,917,984 | 11/1975 | Kong et al. . |
| 3,922,648 | 11/1975 | Buckley . |
| 3,923,359 | 12/1975 | Newsam . |
| 3,980,505 | 9/1976 | Buckley . |
| 4,012,579 | 3/1977 | Fox et al. . |
| 4,052,117 | 10/1977 | Tengler et al. . |

(List continued on next page.)

FOREIGN PATENT DOCUMENTS 57-189393 11/1982 Japan .
2109158-GB-A 5/1983 United Kingdom .

OTHER PUBLICATIONS

820901 U.S. App. Phys. Lett., V41, Mahan, N5, PP479-481.
860811 U.S. Chemical & Engineering News, Aug. 11, 1986, pp. 22-25.
750500 U.S. Electronics, P112 Dougherty, "Dip Switch".
630400 U.S. IBM Bulletin, Vol. 5, No. 11, P. 14.
IBM Technical Disclosure Bulletin, V 21, N 6, PP2320-2321, "Wire Fan-Out Device Carrier".
IEEE J. of Solid State Circuits, V. SC 17, N 1, "A Novel 14 V Programmable 4 KBIT . . . ".
IEEE Trans on Electron Devices, V. Ed-29, N. 8, PP1313-1318.
IEEE Trans on Electron Devices, V. Ed-27, N3, P 517-520.
Intl Electron Devices Meet (IEDM), Tech Dig. P. 132-135, "Laser Prog Vias for Restructurable. . . ".

Primary Examiner—Benedict V. Safourek
Assistant Examiner—Ralph E. Smith
Attorney, Agent, or Firm—Renner, Otto, Boisselle & Sklar

[57] ABSTRACT

The printed circuit board system and method are characterized by the use of at least one integrated circuit path bridging device, preferably a programmable integrated crosspoint switch, mounted to a printed circuit board for enabling electrical interconnection or circuit paths to cross over other electrical interconnection or circuit paths whereby a single plane or surface interconnection system can be given multi-plane interconnection potential or a multi-plane interconnection system can be given increased interconnection potential, while avoiding or minimizing drawbacks associated with multi-plane circuit interconnection systems such as need for plated through holes and relatively high cost.

6 Claims, 1 Drawing Sheet

U.S. PATENT DOCUMENTS

| | | |
|---|---|---|
| 4,072,380 | 9/1978 | Freehauf . |
| 4,090,667 | 5/1978 | Crimmins . |
| 4,146,902 | 3/1979 | Tanimoto et al. . |
| 4,287,569 | 9/1981 | Fukushima . |
| 4,342,069 | 7/1982 | Link . |
| 4,398,235 | 8/1983 | Lutz et al. . |
| 4,401,353 | 8/1983 | McDevitt, Jr. et al. . |
| 4,420,820 | 12/1983 | Preedy . |
| 4,424,578 | 1/1984 | Miyamoto . |
| 4,425,578 | 1/1984 | Haselwood et al. . |
| 4,441,119 | 4/1984 | Link . |
| 4,441,167 | 4/1984 | Principi . |
| 4,458,297 | 7/1984 | Stopper et al. . |
| 4,499,557 | 2/1985 | Holmberg et al. . |
| 4,516,816 | 5/1985 | Winthrop . |
| 4,520,429 | 5/1985 | Hosking . |
| 4,540,226 | 9/1985 | Thompson et al. . |
| 4,545,111 | 10/1985 | Johnson . |
| 4,557,540 | 12/1985 | Forbes et al. . |
| 4,588,239 | 5/1986 | Venaleck . |
| 4,599,705 | 7/1986 | Holmberg et al. . |
| 4,605,941 | 8/1986 | Ovshinsky et al. . |
| 4,609,241 | 9/1986 | Peterson . |
| 4,631,686 | 12/1986 | Ikawa et al. ............ 340/825.83 |
| 4,646,266 | 2/1987 | Ovshinsky et al. ......... 340/825.83 |
| 4,692,787 | 9/1987 | Possley et al. . |

PRINTED CIRCUIT BOARD SYSTEM AND METHOD

RELATED APPLICATION DATA

This application is a continuation-in-part of application Ser. No. 792,482, filed Oct. 29, 1985 and entitled PROGRAMMABLE INTEGRATED CROSSPOINT SWITCH, now abandoned, which is hereby incorporated herein by reference. This application also is related to commonly assigned, concurrently filed U.S. Pat. applications Ser. No. 941,634 entitled ELECTRONIC DEVICE PROGRAMMABLE BY ALUMINUM-SILICON INTERACTION and Ser. No. 941,606 entitled PACKAGE FOR INTEGRATED CROSSPOINT SWITCH; both of which are now abandoned, the entire disclosures of all the above applications hereby are incorporated by reference.

The invention herein described relates to printed circuit board systems and methods of making same.

BACKGROUND

A printed circuit board system, as referred to herein, includes a printed circuit board or the like to which are mounted a plurality of electrical components such as integrated circuit packages, switches, connectors, resistors, capacitors, etc. The electrical components usually are mounted to one side of the printed circuit board with the leads thereof connected to leads of other components by circuit traces on the substrate of the printed circuit board.

The process of designing a printed circuit board system has often been time consuming and costly. The system may call for numerous integrated circuit packages and other electrical devices each having numerous leads that require connection to leads of other components mounted on the printed circuit board and/or other leads of the same device. The design task is complicated by the often limited real estate on the board for the electrical components and circuit traces and by the need to route circuit traces so that they do not cross other circuit traces on the same surface of the board substrate unless their electrical connection is intended. Considerable skill and effort often are needed strategically to locate the system components and circuit traces on the board substrate.

To facilitate or enable the physical layout of some printed circuit board systems, circuit traces have been provided on both sides of the board substrate with plated through holes electrically connecting circuit traces on one side of the board substrate to circuit traces on the other side of the board substrate. More complex systems have necessitated the use of more costly multi-layer printed circuit boards. In multi-layer printed circuit boards, plated through holes are used to connect circuit traces at one layer in the board to circuit traces at one or more layers as is shown, for example, in U.S. Pat. No. 3,923,359. Also, the added board layers do not result in any corresponding increase in real estate for active and passive electrical components. Jumper wires also have been used to move one interconnection path across another in a printed circuit board system.

In the above referenced copending application Ser. No. 792,482, a programmable integrated crosspoint switch is disclosed along with various applications thereof having certain advantages and benefits. As therein indicated, the programmable integrated crosspoint switch may be used to facilitate the manufacture of a printed circuit board system by avoiding or minimizing the need for plated through holes, jumper wires, etc. to move one interconnection path across another interconnection path at a common side or circuit plane of the printed circuit board. The programmable integrated crosspoint switch includes a matrix of first and second pluralities of electrically conductive paths and selectively permanently and affirmatively programmable means for completing passive conductive circuit paths between one or more of the conductive paths of such first and second pluralities thereof. The programmable integrated crosspoint switch electronic programmability characteristic enables economical volume manufacture and end user programming for any desired application. Moreover, its relatively small size, in relation to the programmed and programmable devices disclosed in U.S. Pat. No. 4,588,239, No. 4,557,540 and No. 4,609,241, is important to high density, limited real estate applications. The socket devices shown in these patents had a relatively large footprint and generally were not practical for high density board applications; the devices took up too much real estate which usually is limited to provide a small overall package size for the printed circuit board system.

Presently the design of printed circuit board systems is moving in the direction of surface mount technology wherein the electrical components are mounted to a surface of the printed circuit board rather than through the printed circuit board. Such surface mounting usually is effected without the need for plated through holes that had been required to accommodate the solder tails of non-surface mount components. In those systems employing surface mount technology, plated through holes and consequently multi-layer printed circuit boards are counter-productive, although some use thereof has been found desirable when mounting input/output connection devices such as headers to the printed circuit board for the reasons discussed in copending application Ser. No. 747,343, filed June 21, 1985.

By way of a specific representative example, the casing of an electronic apparatus such as a calculator may double as the substrate of a printed circuit board to reduce size, weight and number of parts. That is, circuit traces may be printed onto the inside surface of the casing and a surface mount technique employed to mount electrical components to the inside surface of the casing. Obviously, this application precludes the use of plated through holes and circuit traces on the outside surface of the casing. Accordingly, the designer is limited to printed circuit interconnections at a single surface or circuit plane and, accordingly, to a correspondingly limited degree of circuit complexity in relation to the interconnection potential of multi-plane circuit interconnection system.

SUMMARY OF THE INVENTION

The present invention encompasses part of the disclosure in copending application Ser. No. 792,482 and expands thereon by setting forth further details of a printed circuit board system and method of making the same. The printed circuit board system hereof is characterized by the use of at least one integrated circuit path bridging device, preferably a programmable integrated crosspoint switch, mounted to a printed circuit board for enabling electrical interconnection or circuit paths to cross over other electrical interconnection or circuit paths whereby a single plane or surface interconnection system can be given multi-plane interconnection potential or a multi-plane interconnection system can be given increased interconnection potential, while avoiding or minimizing drawbacks associated with multi-plane circuit interconnection systems such as need for plated through holes and relatively high cost and/or reducing the need for an extra plane or layer of multi-plane or multi-layer boards.

Fundamentally, the invention relates to a technique for increasing the efficient use of real estate of a printed circuit board and the minimizing of surfaces, planes or layers of a printed circuit board along which conductive traces must travel to achieve desired electrical connections. According to the invention, interconnections are provided between components or the like mounted or connected with respect to the board by low impedance programmable switch-like members. Such switch-like members may be programmed either before or after being installed on the printed circuit board. They may be used not only to increase efficient use of real estate but also to facilitate correction, repair, and/or modifying printed circuit boards even after the boards have been manufactured, for example, by permitting the subsequent interconnection of two or more traces by appropriate programming.

According to a preferred embodiment described in detail below and incorporating the technology, for example, of the above-referenced and incorporated applications, there is employed with a printed circuit board one or more programmable integrated crosspoint switch devices, each of which preferably is selectively programmable to provide specific selected low impedance interconnections, for example at less than about 20 ohms, so that each such interconnection appears electrically essentially as a printed circuit trace of the board. The combination of such low impedance crosspoint switch and the printed circuit board may provide characteristics of multi-layer boards and in any event may be employed to effect an increase in efficient use of real estate of a printed circuit board or the like. A preferred embodiment of the invention utilizes an aluminum-silicon type interaction that is achieved at a specified temperature in response to application of adequate energy input, e.g. current flow through electrically resistive silicon, to form an electrically conductive path through the silicon that is at relatively low impedance, e.g. on the order of from about 5 to about 10 ohms.

According to one aspect of the invention, a printed circuit board system comprises a printed circuit board, a plurality of electrical components mounted to the printed circuit board at a side thereof, and electrical interconnection means for interconnecting leads of the electrical components via respective electrically conductive interconnection paths on the printed circuit board, the interconnection means including passive, integrated circuit bridging means for enabling at least some of the interconnection paths to cross over one another, and electrically separated circuit traces on the printed circuit board connecting the bridging means to respective leads of the electrical components. The bridging means preferably includes a programmable integrated crosspoint switch comprising a matrix of first and second pluralities of electrically conductive paths and selectively permanently and affirmatively programmable means for completing passive conductive circuit paths between one or more conductive paths of such first and second pluralities thereof. The programmable means includes material connected between respective pairs of conductive paths of the first plurality and conductive paths of the second plurality to provide a high impedance path therebetween, this material being responsive to application of an electrical signal thereto exceeding a predetermined threshold level to change permanently to take on a relatively low impedance characteristic effectively completing an electrical circuit between a respective pair of conductive paths.

According to another aspect of the invention, a printed circuit board system comprises a printed circuit board including a substrate and plural electrically separated circuit traces on the substrate, and electrically programmable, passive integrated circuit bridging means mounted with respect to the printed circuit board for effecting in accordance with a permanent programming thereof selected electrical connections between respective circuit traces. The system also includes a plurality of electrical components having leads thereof electrically connected to respective circuit traces, and the bridging means includes a programmable integrated crosspoint switch preferably of the foregoing type.

According to still another aspect of the invention, a method of making a circuit board system is characterized by the step of using at least one integrated device selectively affirmatively passively to interconnect a first plurality of conductive paths on a circuit board to respective conductive paths of a second plurality of electrically conductive paths on the circuit board. The conductive paths may be circuit traces on the circuit board, and the integrated device may be used to effect crossover of interconnection paths between respective leads of the electrical components mounted to the circuit with the leads thereof connected to respective circuit traces.

The foregoing and other features of the invention are hereinafter more fully described and particularly pointed out in the claims, the following description and the annexed drawings setting forth a certain illustrative embodiment of the invention, this being indicative, however, of but one of the various ways in which the principles of the invention may be practiced.

DETAILED DESCRIPTION

Figure 1:
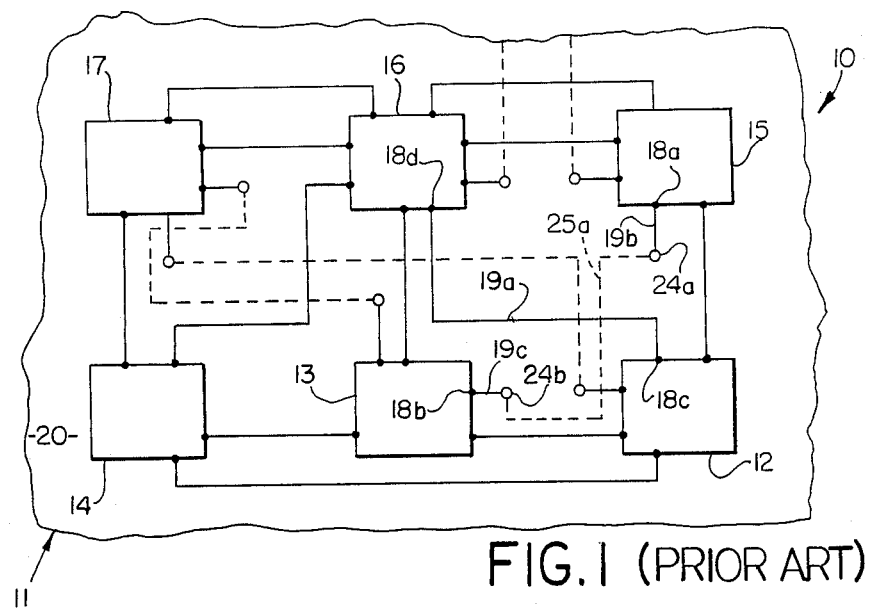
FIG. 1 is a schematic partial plan view of a prior art printed circuit board system.

Referring now in detail to the drawings, an exemplary prior art printed circuit board system employing a conventional component interconnection technique is schematically illustrated at 10 in FIG. 1. The prior art system includes a printed circuit board 11 to which are mounted a plurality of electrical components 12-17. The electrical components are, for example, integrated circuit devices mounted to one side of the printed circuit board each with leads 18 thereof connected to leads of the other components by circuit traces 19 printed on or otherwise applied to the top surface of board substrate 20.

As illustrated, the interconnection paths between some of the leads 18 of the electrical components 12-17 are not located entirely at the top surface or circuit plane of the printed circuit board 11. This is because a circuit trace across the top surface of the substrate 20 between these leads is prevented by other circuit traces interconnecting other leads of the electrical components. For example, lead 18a of electrical component 15 cannot be directly connected by a circuit trace on the top surface of the substrate to lead 18b of electrical component 13 because of interfering circuit trace 19a interconnecting lead 18c of electrical component 12 and 18d of electrical component 16, and other circuit traces when additionally considering round about paths. That is, a circuit trace cannot be applied across the top surface of the substrate between the leads 18a and 18b without the line crossing over another circuit trace or under one of the electrical components.

To provide for interconnection of leads 18a and 18b, the system 10 includes plated through holes 24 in the printed circuit board 11 and circuit traces 25 (broken lines) on the bottom surface (bottom circuit plane) of the substrate 20 (or at another layer in a multi-layer printed circuit board). The lead 18a is electrically connected by upper circuit trace 19b to lower circuit trace 25a on the bottom surface of the substrate via plated through hole 24a; and lower circuit trace 25a is electrically connected via plated through hole 24b to upper circuit trace 19c which is connected to lead 18b. In this manner the interconnection path between leads 18a and 18b is routed to cross the interfering circuit trace 19a but at a different surface or circuit plane of the printed circuit board.

Alternatively jumper wires could be employed to cross interconnection paths but their use is generally less desirable.

Figure 2:
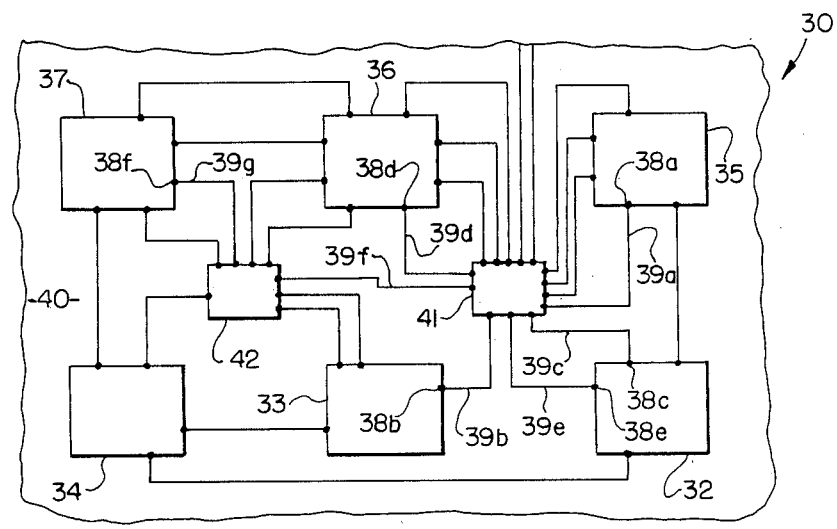
FIG. 2 is a schematic partial plan view of a printed circuit board system according to the invention.

In FIG. 2 an embodiment of a printed circuit board system according to the invention hereof is schematically illustrated at 30. The system 30 includes a printed circuit board 31 to which are mounted a plurality of electrical components 32-37. The electrical components, which for comparison purposes are the same as the integrated circuit devices 22-17 in the prior art system of FIG. 1, are mounted to one side of the printed circuit board each with leads 38 thereof connected to leads of the other components by circuit traces 39 printed on or otherwise applied to the top surface of board substrate 40. Further to facilitate an understanding of the invention, the electrical components 32-37 not only are the same as and equal in number to those illustrated in FIG. 1, but also have an identical lead interconnect assignment schedule. However, the lead interconnections are effected in accordance with the present invention by employing in the illustrated embodiment two programmable integrated crosspoint switches 41 and 42.

The programmable integrated crosspoint switches 41 and 42 are mounted on the top surface of the board substrate 40 along with the other electrical components 32-37 such as by using surface mount technology. The programmable integrated crosspoint switches 41 and 42 preferably are of a type disclosed in copending application Ser. No. 792,482, and most preferably are of a type disclosed in the above concurrently filed application for aluminum silicon interaction programmable electronic device, and are connected by circuit traces 39 to respective leads of the electrical components and also to one another. In the manner discussed in said patent applications the programmable integrated crosspoint switches are programmable, the programming, for example, preferably having been performed prior to mounting to the printed circuit board, to provide the required interconnections between the leads of the electrical components.

Desirably, the switches 41, 42 are operative to provide selectively programmed interconnection paths that are of low electrical impedance, specifically resistance; preferably less than 20 ohms, and most preferably as close to zero resistance as possible. Such selectively programmed interconnection paths, therefor, will appear electrically essentially the same as printed circuit traces on the printed circuit board. Moreover, to facilitate mounting the switches 41, 42 on the printed circuit board, they may include or be included in packages, such as the integrated circuit type of package disclosed in the above-mentioned concurrently filed application for package for integrated crosspoint switch. Such package may be of the dual-in-line type (DIP), of the surface mount type (SMT), or of other type. Alternatively, if desired, the switches 41, 42, etc. may be directly mounted on the printed circuit board using, for example, available bonding and/or like techniques.

More particularly, programmable integrated crosspoint switch 41 is electrically connected by circuit trace 39a to lead 38a of electrical component 35 and by circuit trace 39b to lead 38b of electrical component 33. The programmable integrated crosspoint switch 41 is electrically programmed to close a respective crosspoint switch therein electrically to connect circuit traces 39a and 39b for passive routing of electrical signals therebetween. The signals may be, for example, current or transmitted voltage signals. Similarly, programmable integrated crosspoint switch 41 is electrically programmed to connect circuit traces 39c and 39d for passive routing of electrical signals between lead 38c of electrical component 32 and lead 38d of electrical component 36. Programmable integrated crosspoint switch 41 also is electrically programmed along with programmable integrated crosspoint switch 42 to provide for passive routing of electrical signals between lead 38e of electrical component 32 and lead 38f of electrical component 37 via circuit traces 39e, 39f and 39g.

From the foregoing it can be seen that the programmable integrated crosspoint switches 41 and 42 function as bridging devices enabling electrical interconnection paths to cross over one another for desired passive routing of signals in a single circuit plane or in fewer circuit planes than previously needed. This gives the printed circuit board system of FIG. 2 according to the invention an interconnection path potential equal or greater than that of the multi-plane interconnection system of the prior art system illustrated in FIG. 1.

Moreover, the invention minimizes the need for plated through holes and in the illustrated embodiment of the invention shown in FIG. 2 there is eliminated any need for plated through holes while plated through holes were needed in the prior art system of FIG. 1 to effect the same lead interconnect schedule. Thus, by way of reference to a specific application of the invention, the substrate 40 may be the casing of an electronic assembly with the surface above referred to as the top surface being the inside surface of the casing wall. The electrical components 32-37 then would represent the calculator's logic and support components.

As will be appreciated by those skilled in the art of printed circuit board design, circuit board layout may be advantageously centered around passive bridging devices, preferably programmable integrated crosspoint switches, strategically positioned on the printed circuit board or even in the printed circuit board such as between layers of a multi-layer printed circuit board. Electrical components, for example, may be clustered around respective programmable integrated crosspoint switches utilized to interconnect leads of the components relatively adjacent thereto and/or to interconnect leads of those components to leads of components in another cluster or clusters via circuit traces or other conductive path elements interconnecting the programmable integrated crosspoint switches. The programmable integrated crosspoint switches also may be programmable selectively to activate certain components or clusters of components to provide a post board assembly signature to the board that, for example, could be user selected to provide a selected one of plural board configurations.

Figure 3:
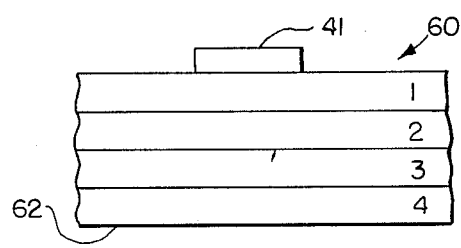
FIG. 3 is a diagrammatic illustration of another embodiment of the invention.

Briefly referring to FIG. 3, an embodiment of the invention employing a particular application of the programmable integrated crosspoint switch is shown at 60. In this embodiment the programmable integrated crosspoint switch 41 is used in conjunction with a multi-layer printed circuit board 62 that has 4 layers. Such multi-layer printed circuit boards are, of course, known in the art. It also is well known that each time an additional layer must be added to a multi-layer printed circuit board, the cost for and complexity of the board (including the manufacturing complexity) increases appreciably. However, by using the programmable integrated crosspoint switch 41 of the invention with the multi-layer board, e.g., to effect various cross over points and so on, as was described in detail above and in application Ser. No. 792,482 and concurrently filed application for aluminum silicon interaction programmable electronic device, the four layer multi-layer printed circuit board takes on the effect of a more than four layer printed circuit board, such as a five or more layer board. The result is a substantial facilitating of board designing and manufacturing and a corresponding reduction in the price of the multi-layer board.

What is claimed is:

1. A printed circuit board system comprising a printed circuit board, a plurality of electrical components mounted to said printed circuit board at a side thereof, electrically conductive traces on said printed circuit board and electrical interconnection means for interconnecting selected leads of said electrical components via said electrically conductive traces on said printed circuit board thereby forming respective electrically conductive interconnection paths on said printed circuit board, said electrical interconnection means including bridging means for enabling at least some of said interconnection paths to cross over to another to effect electrical conductive interconnection of respective electrically conductive traces and of respective leads of said electrical components, said bridging means comprising a passive, programmable integrated crosspoint switch programmable to be electrically conductive, and wherein said programmable integrated crosspoint switch includes a matrix of first and second pluralities of electrically conductive paths and selectively permanently and affirmatively programmable means for completing passive conductive circuit paths between one or more conductive paths of such first and second pluralities thereof.

2. A system as set forth in claim 1, wherein said programmable means includes material connected between respective pairs of conductive paths of said first plurality and conductive paths of said second plurality to provide a high impedance path therebetween, said material being responsive to application of an electrical signal thereto exceeding a predetermined threshold level to change permanently to take on a relatively low impedance characteristic effectively completing an electrical circuit between a respective pair of conductive paths.

3. A system as set forth in claim 2, wherein said material includes an amorphous or polycrystalline silicon material.

4. A printed circuit board system comprising a printed circuit board with respect to which a plurality of electrical components may be mounted, electrically separated circuit traces on said printed circuit board for connecting with respective terminals of such respective electrical components, and electrical interconnection means for interconnecting leads of such electrical components via respective electrically conductive interconnection paths on said printed circuit board, said circuit traces being electrically connected to respective electrically conductive interconnection paths, said interconnection means including passive, integrated circuit bridging means for enabling at least some of said interconnection paths effectively to cross over one another, said electrically separated circuit traces on said printed circuit board connecting said bridging means to respective leads of such electrical components, said bridging means comprising a programmable integrated crosspoint switch, and wherein said electrically conductive interconnection paths of said programmable integrated crosspoint switch includes a matrix of first and second pluralities of electrically conductive paths and selectively permanently and affirmatively programmable means for completing passive conducive circuit paths between one or more conductive paths of such first and second pluralities thereof.

5. The system of claim 4, said bridging means being mounted directly to the printed circuit board.

6. In an electrical circuit system including electrically conductive signal paths on a surface for electrically connecting with respective electrical components, the improvement comprising electrical interconnection means for interconnecting selected terminals of such electrical components via such electrically conductive signal paths thereby forming respective electrically conductive interconnection paths on such surface, said electrical interconnection means including bridging means for enabling at least some of said interconnection paths to cross over to another to effect electrical conductive interconnection of respective electrically conductive signal paths and of respective terminals of such electrical components, said bridging means comprising a passive, programmable integrated crosspoint switch programmable to be electrically conductive, and wherein said programmable integrated crosspoint switch includes a matrix of first and second pluralities of electrically conductive paths and selectively permanently and affirmatively programmable means for completing passive conductive circuit paths between one or more electrically conductive paths of such first and second pluralities thereof.

* * * * *